United States Patent [19]

Suzuki et al.

[11] 4,326,268
[45] Apr. 20, 1982

[54] MAGNETIC BUBBLE MEMORY DEVICE

[75] Inventors: Ryo Suzuki, Kodaira; Keiichi Uehara; Teruaki Takeuchi, both of Kokubunji; Masatoshi Takeshita, Hachioji, all of Japan

[73] Assignee: Hitachi, Ltd., Tokyo, Japan

[21] Appl. No.: 174,437

[22] Filed: Aug. 1, 1980

[30] Foreign Application Priority Data

Aug. 15, 1979 [JP] Japan .................. 54-103137

[51] Int. Cl.³ .................................. G11C 19/08
[52] U.S. Cl. ............................. 365/15; 365/12
[58] Field of Search ................... 365/7, 8, 15, 12

[56] References Cited

U.S. PATENT DOCUMENTS

| | | | |
|---|---|---|---|
| 4,075,611 | 2/1978 | Gergis | 365/15 |
| 4,133,043 | 1/1979 | Hiroshima et al. | 365/15 |
| 4,161,788 | 7/1979 | Rosenblum | 365/15 |
| 4,168,535 | 9/1979 | Belser | 365/15 |

*Primary Examiner*—James W. Moffitt
*Attorney, Agent, or Firm*—Craig and Antonelli

[57] ABSTRACT

A magnetic bubble memory device according to this invention comprises a plurality of minor loops, a read-out major line is disposed at one end of the minor loops through gates having a replicating function, and a magnetic bubble detector which includes a detecting line is disposed at one end of the major line. Further, a propagation length from the other end of the read-out major line to the detecting line of the magnetic bubble detector is set at a bit length which slightly exceeds four times the number of the minor loops. For this reason, a continuous read-out operation at high speed is permitted without the influence of replicate pulses.

5 Claims, 10 Drawing Figures

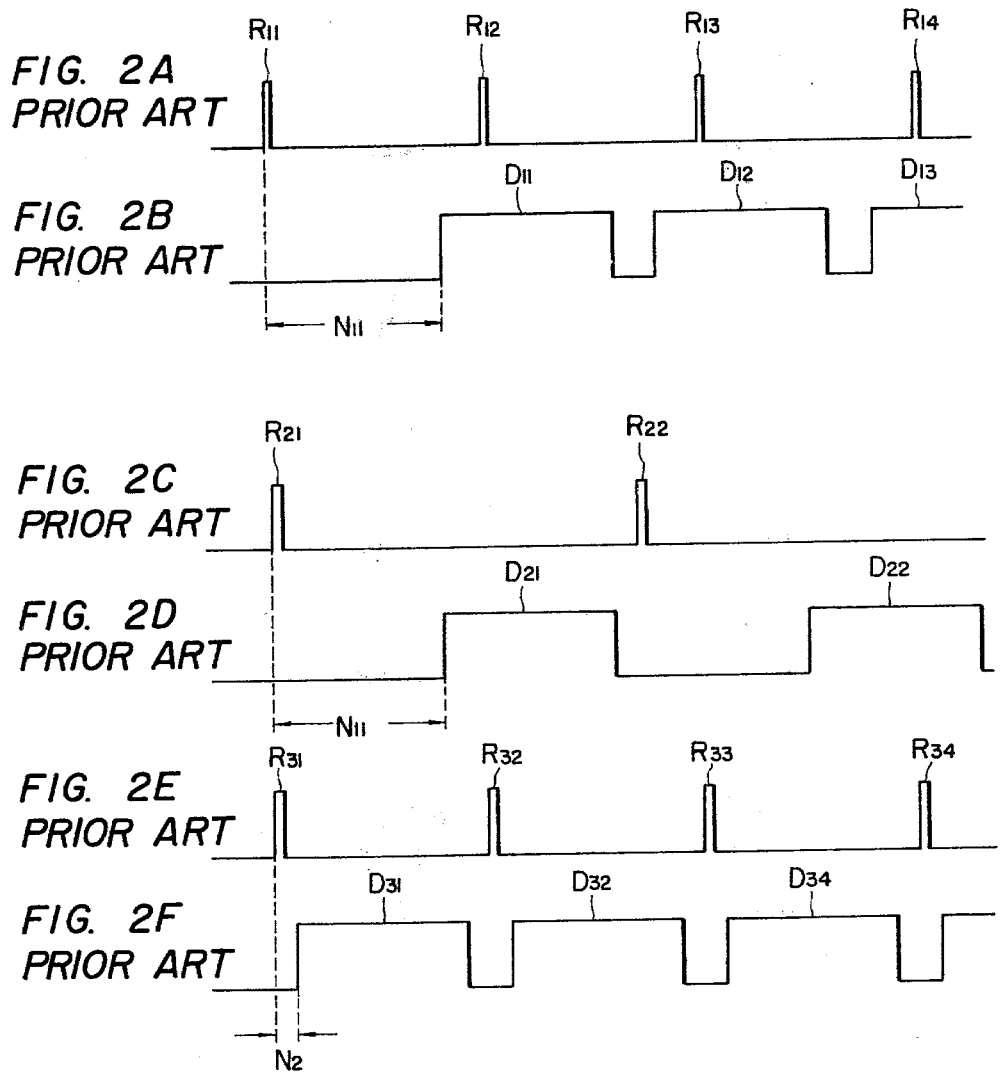

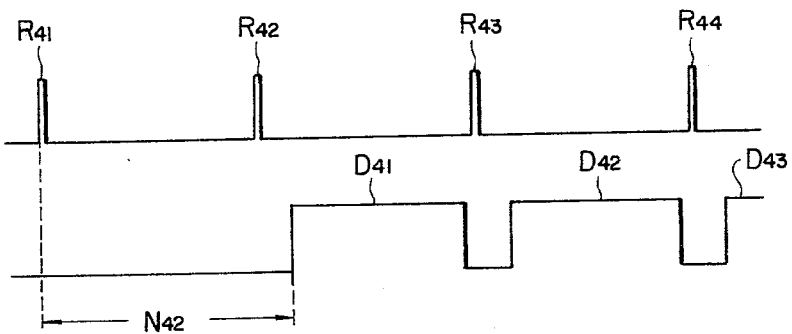
FIG. 3A
FIG. 3B
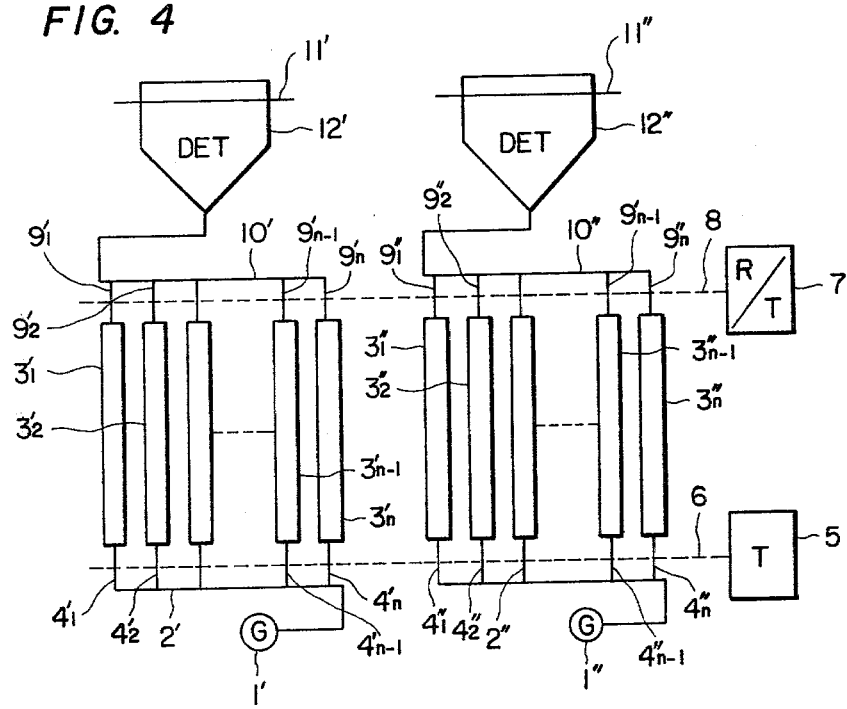
FIG. 4

MAGNETIC BUBBLE MEMORY DEVICE

BACKGROUND OF THE INVENTION

1. Field of the Invention

This invention relates to a magnetic bubble memory, and more particularly to a magnetic bubble memory device capable of continuous read-out of information from minor loops in such memory.

2. Description of the Prior Art

Regarding the organizations of magnetic bubble memory devices, a large number of organizations have heretofore been proposed. Among them, what is called the "major-minor loops" organization has been usually employed. Further, there has recently been proposed an organization in which the conventional typical "major-minor loops" organization is modified in order to enhance the read-out cycle time. A typical example of the organization is shown in FIG. 1. Referring to the figure, magnetic bubbles generated by a magnetic bubble generator 1 are propagated on a write-in major line 2 in accordance with a rotating magnetic field. When the magnetic bubbles on the write-in major line 2 have reached the respective positions of write-in gates $4_1$-$4_n$ corresponding to a large number of minor loops $3_1$-$3_n$, transfer pulses from a transfer pulse source 5 are caused to flow through a conductor 6. Thus, the write-in gates $4_1$-$4_n$ are simultaneously enabled, and the magnetic bubbles on the write-in major line 2 are transferred into the minor loops $3_1$-$3_n$ in information word unit. Thereafter, the magnetic bubbles in the minor loops $3_1$-$3_n$ are circulated therein in accordance with the rotating magnetic field.

Subsequently, the magnetic bubbles circulating within the respective minor loops $3_1$-$3_n$ as lie in positions corresponding to read-out gates $9_1$-$9_n$ of the minor loops $3_1$-$3_n$ are replicated in such a way that replicate pulses from a replicate/transfer pulse source 7 are caused to flow through a conductor 8. At the same time, the replicated magnetic bubbles are transferred onto a read-out major line 10 in the information word unit. Thereafter, the magnetic bubbles are propagated on the read-out major line 10 in accordance with the rotating magnetic field and arrive at an expansion detector 12 having a detecting line 11. Each of the magnetic bubbles is expanded in the lateral direction while propagating in the expansion detector 12, and when it passes through the detecting line 11, the existence thereof is detected as an electric signal.

In a case where most of the information (represented in the forms of the existence and non-existence of the magnetic bubbles) stored in the minor loops $3_1$-$3_n$ are to be read out in the shortest period of time in the magnetic bubble memory organization described above (this case being termed the "continuous read-out"), the continuous read-out has heretofore been carried out in accordance with operational time charts illustrated in FIGS. 2A and 2B. A pulse line shown in FIG. 2A consists of the replicate pulses $R_{1n}$ at the continuous read-out operation, and they are caused to flow through the conductor 8 by the replicate/transfer pulse source 7. Since the continuous read-out operation is performed, the intervals between the adjacent pulses are constant. FIG. 2B shows strobing pulses $D_{1n}$ at the time when the magnetic bubbles replicated and transferred from the minor loops $3_1$-$3_n$ onto the read-out major line 10 by the replicate pulses $R_{1n}$ are detected by the detecting line 11 of the detector 12. That is, the magnetic bubbles in the minor loops $3_1$-$3_n$ are replicated by the first replicate pulse $R_{11}$, and the replicated magnetic bubbles are transferred onto the read-out major line 10 in the information word unit. The magnetic bubbles on the read-out major line 10 propagate thereon in accordance with the rotating magnetic field, and after the lapse of a period of time $N_{11}$ from the replicate pulse $R_{11}$, they reach the detector 12, in which they are successively detected by passing through the detecting line 11. The strobing pulse at this time is that $D_{11}$. The information to be subsequently read out as are stored in the minor loops $3_1$-$3_n$ are similarly read out onto the major line 10 by the next replicate pulse $R_{12}$. At this time, the information read out by the replicate pulse $R_{11}$ are being detected by the detecting line 11 of the detector 12 as apparent from the strobing pulse $D_{11}$ in FIG. 2B. Likewise, when the information read out by the replicate pulse $R_{12}$ are being detected by the detecting line 11, the next replicate pulse $R_{13}$ is generated.

When the replicate pulses $R_{1n}$ and the strobing pulses $D_{1n}$ lie in such operational timing relationship, noises ascribable to the replicate pulses $R_{1n}$ exert influence on the detector 12. This has led to the disadvantage that the noise are superposed on the detection outputs by the detecting line 11, to hinder the normal operation of the detector 12. There may be considered operational timings as shown in FIGS. 2C and 2D wherein, in order to avoid the influence of replicate pulses $R_{2n}$ at the detection, after all the information read out with the replicate pulse $R_{21}$ have passed through the detecting line 11, the next replicate pulse $R_{22}$ is generated. With such operational timings, however, a period of time required for reading out necessary information becomes very long, which is not practical.

To the end of solving this problem, operational timings as shown in FIGS. 2E and 2F may be considered. However, a memory organization in which information read out with a replicate pulse $R_{31}$ reach the detecting line 11 in a short time $N_2$ is, in actuality, impossible in view of the construction of the detector 12.

SUMMARY OF THE INVENTION

It is accordingly an object of this invention to provide a novel magnetic bubble memory device which is free from the disadvantage stated above, that is, which is capable of continuous read-out of the information without exerting influence on the detector.

To the accomplishment of the object, according to this invention, a magnetic bubble memory device is characterized by comprising a plurality of minor loops, a read-out major line which is disposed at one-end of said minor loops through gates having at least a replicating function, and a magnetic bubble detector which includes a detecting line and which is disposed at one end of said read-out major line, the propagation length from the other end of said read-out major line to said detecting line of said magnetic bubble detector being set at a bit length which exceeds four times the number of said minor loops.

In accordance with such characterizing construction of this invention, the operational timings of a replicating operation and a detecting operation do not overlap, so that the detecting operation is not hindered. Moreover, since a continuous read-out operation of the information is possible, the period of time required for read-out can be shortened.

BRIEF DESCRIPTION OF THE DRAWING

FIGS. 2A–2F are operational timing charts of a prior-art memory arrangement, FIGS. 3A and 3B are operational timing charts of a memory arrangement according to this invention, and FIG. 4 is a memory arrangement plan of another embodiment according to this invention.

DETAILED DESCRIPTION

Figure 1:
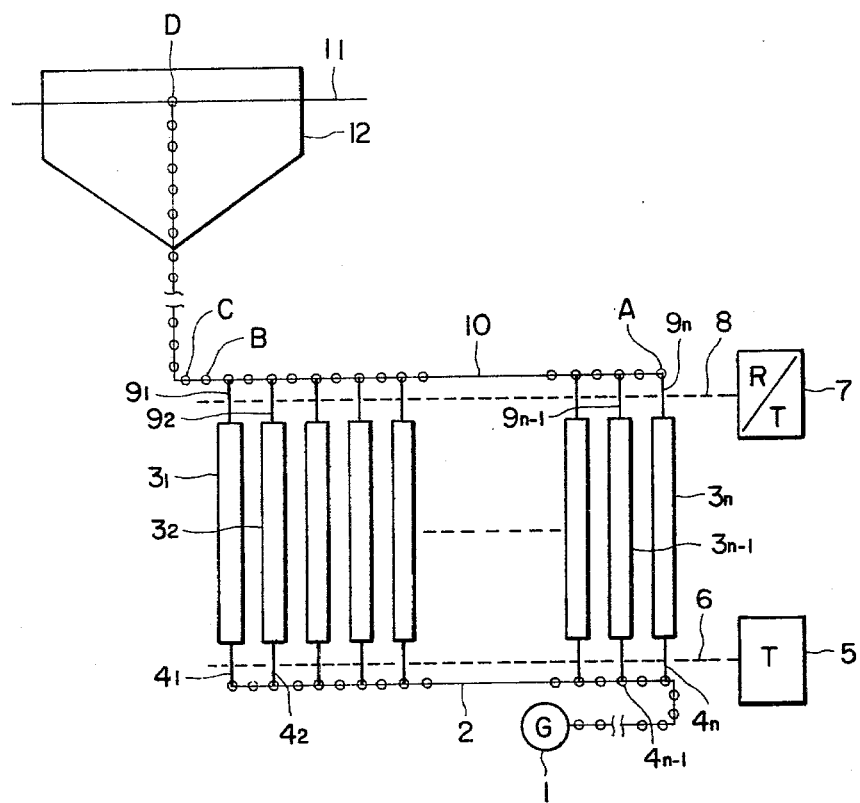
FIG. 1 is an arrangement plan of a magnetic bubble memory device according to this invention.

The general arrangement of a magnetic bubble memory device according to this invention is quite the same as that of the magnetic bubble memory device described in detail with reference to FIG. 1. The point of difference between the prior-art memory arrangement and the memory arrangement according to this invention resides in the length (ordinarily, represented by the number of bits) of a magnetic bubble propagation path from one end of the read-out major line 10 to the detecting line 11 of the expansion detector 12.

More specifically, the number of bits from a bit position A on the read-out major line 10 corresponding to the read-out gate $9_n$ of the minor loop $3_n$ to a bit position D on the detecting line 11 in FIG. 1 is the length of the magnetic bubble propagation path. In this length, a propagation length from the bit position A to a bit position B is determined by the number of the minor loops $3_1$–$3_n$, and it is 2·n where n denotes the number of the minor loops. The characterizing feature of this invention consists in that a magnetic bubble propagation length from a bit position C on the read-out major line 10 to the bit position D on the detecting line 11 in the expansion detector 12 is defined to be (2·n+g) bits. Here, g denotes the number of extra dummy bits and is an integer of at least 1 (one). In other words, the magnetic bubble memory device according to this invention is characterized in that the magnetic bubble propagation length from the bit position A on the read-out major line 10 to the bit position D on the detecting line 11 of the detector 12 is set at (4·n+g) bits. Here, n and g denote the number of the minor loops and the number of the extra dummy bits as stated above, respectively.

The operational timing relationship between the replicating operation and the detecting operation based on such construction of the magnetic bubble memory device will be described with reference to FIGS. 3A and 3B. FIG. 3A illustrates a line of replicate pulses $R_{4n}$ and FIG. 3B a line of strobing pulses $D_{4n}$, and since the details of these pulses have been explained in relation to the prior-art operational timings shown in FIGS. 2A–2F, they are omitted here. Referring to FIGS. 3A and 3B, the first information is read out onto the read-out major line 10 by the first replicate pulse $R_{41}$. Before the magnetic bubble representative of the information of the first bit in the information firstly read out arrives at the detecting line 11 in the detector 12, the next replicate pulse $R_{42}$ is generated and the next information is read out. Immediately after the generation of the replicate pulse $R_{42}$, that is, after the lapse of a period of time $N_{42}$ from the replicate pulse $R_{41}$, the detecting operation is started. This period of time $N_{42}$ is evaluated in such a way that the number of bits (2·n+g) from the bit position C to the bit position D is multiplied by the period of the rotating magnetic field. The strobing pulse at that time is indicated by $D_{41}$. The third replicate pulse $R_{43}$ is generated immediately after the last bit of the information read out by the first replicate pulse $R_{41}$ has passed through the detecting line 11. Thereafter, the detecting operation of the information read out by the second replicate pulse $R_{42}$ is started. Thenceforth, similar operations are continuously repeated. More specifically, the replicating operation in the memory arrangement according to this invention is performed by generating the replicate pulse $R_{4n}$ at a timing corresponding to when the extra dummy bit or bits g considered to exist between two information read out on the read-out major line 10 based upon the propagating length from bit position A to bit position D reaches/reach the detecting line 11. Accordingly, the detection output is meaningless and is neglected. This output can be removed very easily because the number of bits of the information is fixed. The pulse width of the replicate pulse $R_{4n}$ is usually less than a half of the period of the rotating magnetic field, and a propagating length corresponding to one extra dummy bit g suffices in the magnetic bubble memory device shown in FIG. 1. However, it is ordinarily desirable to set the propagating length to correspond to several extra dummy bits g. The addresses of the information in the minor loops $3_1$–$3_n$ are allocated so as to make the continuous read-out of the information possible, and this allocation can be simply made.

EMBODIMENT 1

By applying this invention, magnetic bubble memory chips having a memory capacity of 64 Kbits per chip were produced. The memory arrangement was the same as that shown in FIG. 1. The specifications of the memory chip were as follows.

The number of minor loops was 128, and each of the minor loops had a memory capacity of 513 bits. The bit length from the bit position A to the bit position D was 522 bits. That is the propagation length or bit length included the provision for the number g of extra dummy bits of 10.

On the other hand, in a prior-art chip of 64 Kbits, the bit length from the bit position A to the bit position D was 384 bits.

EMBODIMENT 2

FIG. 4 shows another embodiment of the magnetic bubble memory device according to this invention. As seen from the figure, this embodiment is constructed of two sets of the arrangement illustrated in FIG. 1 and thus permits the continuous read-out and continuous detection. Minor loops $3_1'$–$3_n'$ and $3_1''$–$3_n''$ have numbers of loops obtained by equally dividing the minor loops $3_1$–$3_n$ in FIG. 1, respectively. The operation of each set is as has been explained with reference to FIG. 1, but the operation of the whole arrangement can realize the continuous read-out and continuous detection of information owing to the organic coupling of the two sets. More specifically, a propagation length from a generator 1' to a bit position on a write-in major line 2' corresponding to a write-in gate $4_n'$ of the minor loop $3_n'$ and a propagation length from a generator 1'' to a bit position on a write-in major line 2'' corresponding to a write-in gate $4_n''$ of the minor loop $3_n''$ are endowed therebetween with a difference of bit lengths equal to one period of the rotating magnetic field.

Further, a propagation length to a detector 12' from a bit position on a read-out major line 10' corresponding to a read-out gate $9_1'$ of the minor loop $3_1'$ and a propagation length to a detector 12'' from a bit position on a read-out major line 10″ corresponding to a read-out gate 9₁″ of the minor loop 3₁″ are endowed therebetween with a difference of bit lengths also equal to one period of the rotating magnetic field. Of course, a propagation length from one end of the read-out major line 10′ to a detecting line 11′ and a propagation length from one end of the read-out major line 10″ to a detecting line 11″ are set so as to include the corresponding numbers of bits satisfying this invention (numbers g of extra dummy bits being desirably 2 or more), respectively. Moreover, a difference equal to one period is provided between them.

As a result, odd-numbered bits and even-numbered bits in a line of information bits to be written in are distributed and written into the minor loops $3_1'-3_n'$ and $3_1''-3_n''$ within the left and right sets. When the read-out is similarly considered, the information in the left and right sets are detected alternately and continuously. Owing to such memory arrangement, the continuous read-out of information can be performed without affecting the detecting operation, and the continuous detection is simultaneously permitted, so that an operation of higher speed is realized.

The magnetic bubble memory device according to this invention demonstrates its performance to the utmost when it conducts the continuous read-out operation. However, it undergoes quite no inconvenience even in the usual read-out operation and is very versatile.

As set forth above, the magnetic bubble memory device according to this invention becomes capable of the continuous read-out operation of high speed without hampering the detecting operation because the operational timings of the replicating operation and the detecting operation do not overlap each other. In consequence, a magnetic bubble memory device of high reliability for high-speed continuous read-out is provided.

We claim:

1. A magnetic bubble memory device comprising a plurality of minor loops, a read-out major line which is disposed at one end of said minor loops through gates having at least a replicating function, and a magnetic bubble detector which includes a detecting line and which is disposed at one end of said read-out major line, said read-out major line having the other end thereof connected through one of the gates to the one of said minor loops positioned furthest away from said magnetic bubble detector, a propagation length from the other end of said read-out major line to said detecting line of said magnetic bubble detector being a bit length which exceeds four times the number of said minor loops.

2. A magnetic bubble memory device according to claim 1, further comprising a write-in major line disposed at the other end of said minor loops through gates, said write-in major line having a magnetic bubble generator at one end.

3. A magnetic bubble memory device according to claim 1, wherein the propagation length from the other end of said read-out major line to said detecting line of said magnetic bubble detector exceeds four times the number of said minor loops by at least one bit position so as to enable continuous read-out of information stored in said minor loops without superposition of noise on outputs of the magnetic bubble detector attributable to generation of replicating pulses.

4. A magnetic bubble memory device comprising a plurality of minor loops arranged in two sets, a read-out major line being disposed at one end of each set of said minor loops through gates having at least a replicating function, and a magnetic bubble detector which includes a detecting line being disposed at one end of each of said read-out major lines, each of said read-out major lines having the other end thereof connected through one of the gates to the one of said minor loops of the associated set positioned furthest away from said magnetic bubble detector for the associated set, a propagation length from the other end of each of said read-out major lines to said detecting line of said magnetic bubble detector for the associated set being a bit length which exceeds four times the number of said minor loops of the associated set.

5. A magnetic bubble memory device according to claim 4, further comprising a write-in major line disposed at the other end of each set of said minor loops through gates, each of said write-in major lines having a magnetic bubble generator at one end.

* * * * *